(12) United States Patent
Zhang

(10) Patent No.: US 11,742,303 B2
(45) Date of Patent: Aug. 29, 2023

(54) SYSTEMS FOR MILLIMETER-WAVE CHIP PACKAGING

(71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 320 days.

(21) Appl. No.: 17/120,061

(22) Filed: Dec. 11, 2020

(65) Prior Publication Data

US 2022/0157747 A1    May 19, 2022

(51) Int. Cl.
*H01L 23/66* (2006.01)
*H01P 3/00* (2006.01)

(52) U.S. Cl.
CPC .............. *H01L 23/66* (2013.01); *H01P 3/003* (2013.01); *H01L 2223/6616* (2013.01); *H01L 2223/6627* (2013.01)

(58) Field of Classification Search
CPC ............. H01L 23/66; H01L 2223/6616; H01L 2223/6627; H01P 3/003
See application file for complete search history.

(56) References Cited

U.S. PATENT DOCUMENTS

| 9,941,226 | B2 | 4/2018 | Tsai et al. | |
| 2002/0019075 | A1* | 2/2002 | Brand | H01L 24/11 |
| | | | | 257/E21.511 |
| 2014/0145883 | A1* | 5/2014 | Baks | H01L 23/66 |
| | | | | 343/700 MS |

* cited by examiner

*Primary Examiner* — Tucker J Wright
(74) *Attorney, Agent, or Firm* — North Weber & Baugh LLP; Michael North

(57) ABSTRACT

Various system embodiments for millimeter-wave chip packaging are disclosed in the present disclosure for smooth millimeter wave signal transition and good multi-channel signal isolation. The chip packaging features a substrate and a chip electrically connected using a plurality of metal pillars. A signal pillar and surrounding metal pillar may form a ground-signal-ground (GSG) pillar structure. A chip coplanar waveguide (CPW) structure may be formed on the chip around a signal path. A substrate CPW structure may also be form around a signal strip, which is electrically connected to the signal path. Characteristic impedances of the GSG pillar structure, the chip CPW structure and the substrate CPW structure may be within a predetermined range of each other to ensure smooth millimeter wave signal transition with minimum signal loss or distortion.

9 Claims, 13 Drawing Sheets

SYSTEMS FOR MILLIMETER-WAVE CHIP PACKAGING

CROSS-REFERENCE TO RELATED APPLICATIONS

This application claims foreign priority to Chinese Patent Application No. 202011286643.9, entitled "SYSTEMS FOR MILLIMETER-WAVE CHIP PACKAGING", naming Cemin Zhang as inventor, and filed Nov. 17, 2020, the subject matter of which is hereby incorporated herein by reference.

BACKGROUND

A. Technical Field

The present invention relates generally to systems for chip packaging, and more particularly to systems for millimeter-wave chip packaging.

B. Background of the Invention

Millimeter waves refer to radio waves in the electromagnetic spectrum from 30 to 300 GHz. Millimeter waves are used in various applications, including remote sensing, 5G telecommunication, autonomous vehicular communications, etc.

Chip packaging is the stage of encapsulating an integrated circuit (IC) chip in a supporting case that prevents physical damage and supports electrical contacts which connect the chip to external circuit or a circuit board. For millimeter-wave chips, when millimeter-wave signals are transmitted into or out of the chips, excessive loss or distortion may happen. Furthermore, when a millimeter-wave chip has multiple channels of millimeter-wave signals, due to the physical proximity between those channels, the signal from one channel tends to crosstalk to other channels through chip substrate leakage and/or spatial radiation, it is thus challenging to have channel isolation to prevent inter-channel interference, especially when the multiple channels of millimeter-wave signals are transmitted into or out of the chips simultaneously.

Accordingly, there is a need for systems for millimeter-wave chip packaging for smooth millimeter wave signal transition and good multi-channel signal isolation.

SUMMARY OF THE INVENTION

The present disclosure provides system embodiments for millimeter-wave chip packaging for smooth millimeter wave signal transition and good multi-channel signal isolation.

In one or more embodiments, this invention features a substrate and a chip. The substrate comprises a top metal layer, a bottom metal layer, and an insulation layer between the top metal layer and the bottom metal layer. Materials with low dielectric loss may be chosen for the insulation layer for better high frequency performance. The top metal layer comprises a top ground layer and a first top signal strip. The bottom metal layer comprises a bottom ground layer. The top ground layer and the bottom ground layer are electrically connected by one or more substrate vias through the insulation layer. The chip comprises a first ground plane electrically connecting to the top ground layer via a plurality of metal pillars deposited on the first ground plane. The chip also comprises a first signal pad electrically connected to the first top signal strip via a first signal pillar deposited on the first signal pad. The first signal pillar has at least one metal pillar connected to ground on each side to form a ground-signal-ground (GSG) pillar structure cross-sectionally. Characteristic impedance of the GSG pillar structure may be set at a desired value for smooth millimeter wave signal transition. The chip also comprises a first signal path electrically connected to the first signal pad.

In one or more embodiments, a first coplanar waveguide (CPW) structure comprising the first ground plane and the first signal pad is formed on the chip. The first CPW structure may have a characteristic impedance the same or within a predetermined range of the characteristic impedance of the GSG pillar structure to lessen signal distortion or loss during millimeter wave signal transmission into or out of the chip.

In one or more embodiments, the top ground layer of the substrate has a first groove surrounding the first top signal strip. The first top signal strip, the top ground layer and the insulation layer form a substrate CPW structure, which may set a characteristic impedance the same or within a predetermined range of the characteristic impedance of the GSG pillar structure to lessen signal distortion or loss during millimeter wave signal transmission from the substrate to the GSG pillar, or vice versa.

In one or more embodiments, the chip further comprises a second ground plane positioned above the first signal path. The second ground plane electrically connects the first ground plane via a plurality of on-chip metal-to-metal vias. With the second ground plane, the first CPW structure becomes a coplanar waveguide with ground (CPWG) structure, which provides enhanced isolation of the first signal path within the chip.

In one or more embodiments, the chip further comprises a second signal path separated from the first signal path by a ground section. A second ground plane, electrically connected to the first ground plane and the ground section via a plurality of on-chip metal-to-metal vias, is positioned above the first signal path and the second signal path. Accordingly, a first CPWG structure around the first signal path and a second CPWG structure around the second signal path are formed. These two CPWG structures provide inter-path signal isolation within the chip to suppress signal interference from chip substrate leakage between signal paths. Furthermore, ground connected metal pillars longitudinally aligned on both sides of each signal path effectively enhance spatial isolation between signal paths. In one or more embodiments, the second ground plane of the chip is a backside metal plane electrically connected to the first ground plane via a plurality of through-chip vias.

In one or more embodiments, the chip is a flipped chip (FC), the chip and the substrate structure form a flipped chip-quad-flat no-leads (FC-QFN), a flipped chip-land grid array (FC-LGA), or a flipped chip-ball grid array (FC-BGA) configuration for surface-mount packaging.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Figure 1:
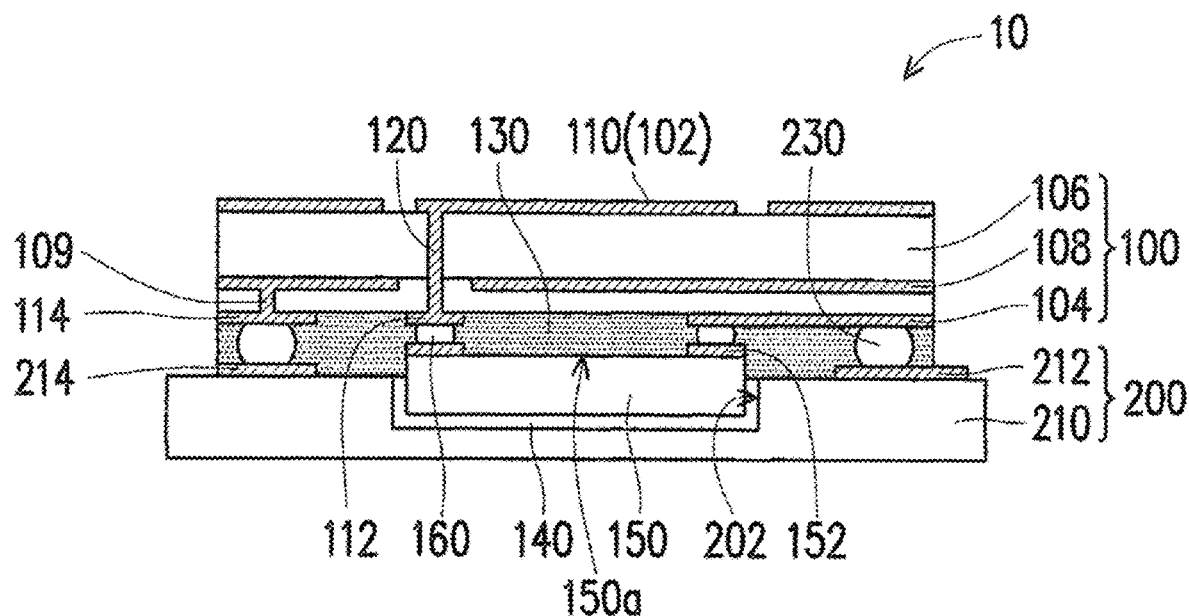
FIG. 1 depicts a cross-sectional view of a prior art integrated millimeter-wave chip package structure.

U.S. Pat. No. 9,941,226B2 discloses an integrated millimeter-wave chip package structure as shown in FIG. 1. The integrated millimeter-wave chip package structure 10 includes an interposer structure 100, a millimeter-wave chip 150 and a substrate 200. The interposer structure 100 includes a first metal layer 102, a second metal layer 104, an insulating support layer 106 located between the first and second metal layers 102/104, and at least one plated through-hole structure 120. The plated through-hole structure 120 penetrates through the interposer structure 100 (through the first metal layer 102, the insulating support layer 106 and the second metal layer 104) and electrically connects the second metal layer 104 and the first metal layer 102. The first metal layer 102 includes at least an antenna pattern 110. The second metal layer 104 may be a wiring layer including a plurality of pads 112 and 114. The plated through-hole structure 120 may be formed by forming a through-hole by etching or laser drilling and then forming a plated through-hole structure by electroplating.

Although the integrated millimeter-wave chip package structure 10 utilizes the plated through-hole structure to electrically connect the antenna pattern and to feed the signal to the antenna, there is no disclosure of implementations for smooth millimeter wave signal transition and multi-channel signal isolation. Accordingly, there is a need for systems for millimeter-wave chip packaging for smooth millimeter wave signal transition and good multi-channel signal isolation.

Embodiment 1

Figure 2:
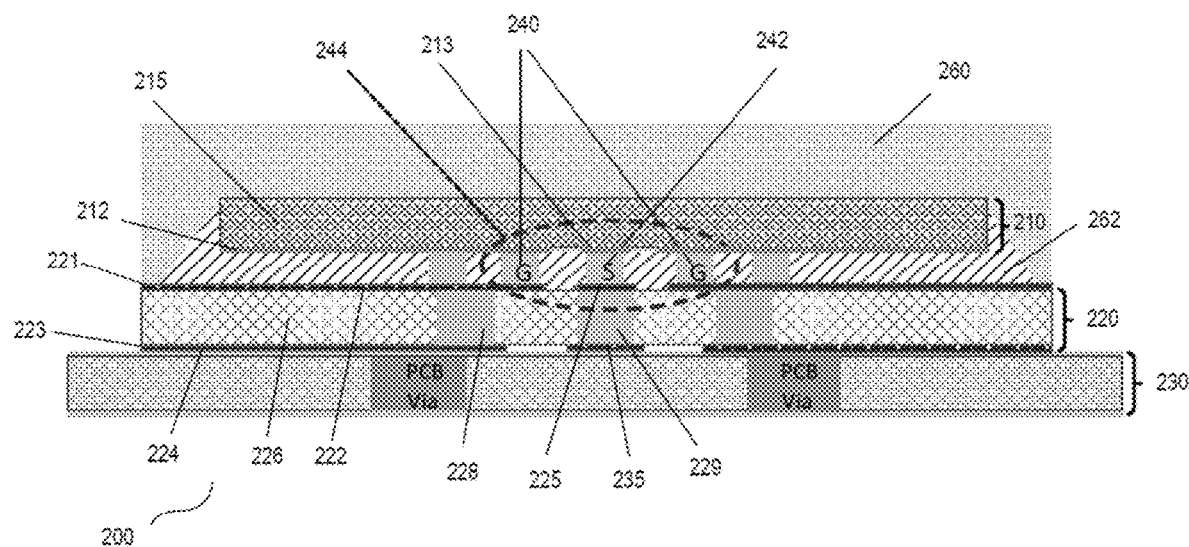
FIG. 2 depicts a cross-sectional view of a chip package according to one or more embodiment of the invention.

FIG. 2 depicts a cross-sectional view of a chip package 200 according to embodiment 1 of the invention. The chip package 200 comprises a chip 210 and a substrate 220. The substrate 220 comprises a top metal layer 221, a bottom metal layer 223, and an insulation layer 226 between the top metal layer and the bottom metal layer. The top metal layer comprises a top ground layer 222 and a first top signal strip 225. The bottom metal layer comprises a bottom ground layer 224 and a first bottom signal strip 235. The top ground layer and the bottom ground layer are electrically connected by one or more substrate vias 228 through the insulation layer 226. The first top signal strip 225 electrically insulated from the top ground layer 222. The chip 210 comprises a first ground plane 212 electrically connects to the top ground layer 222 via a plurality of metal pillars 240 deposited on the first ground plane 212. The chip 210 also comprises a first signal pad 213 electrically connected to the first top signal strip 225 via a first signal pillar 242 deposited on the first signal pad. The chip 210 also comprises a chip substrate layer 215 above the first ground plane 212 and the first signal pad 213. The chip 210 is flipped mounted on to the substrate 220, and usually called flip-chip.

In one or more embodiments, the first signal pillar 242 has at least one metal pillar connected to ground on each side to form a ground-signal-ground (GSG) pillar structure 244 cross-sectionally. Characteristic impedance of the GSG pillar structure may be set at a desired value, e.g., 50Ω, for smooth millimeter wave signal transition.

Figure 3:
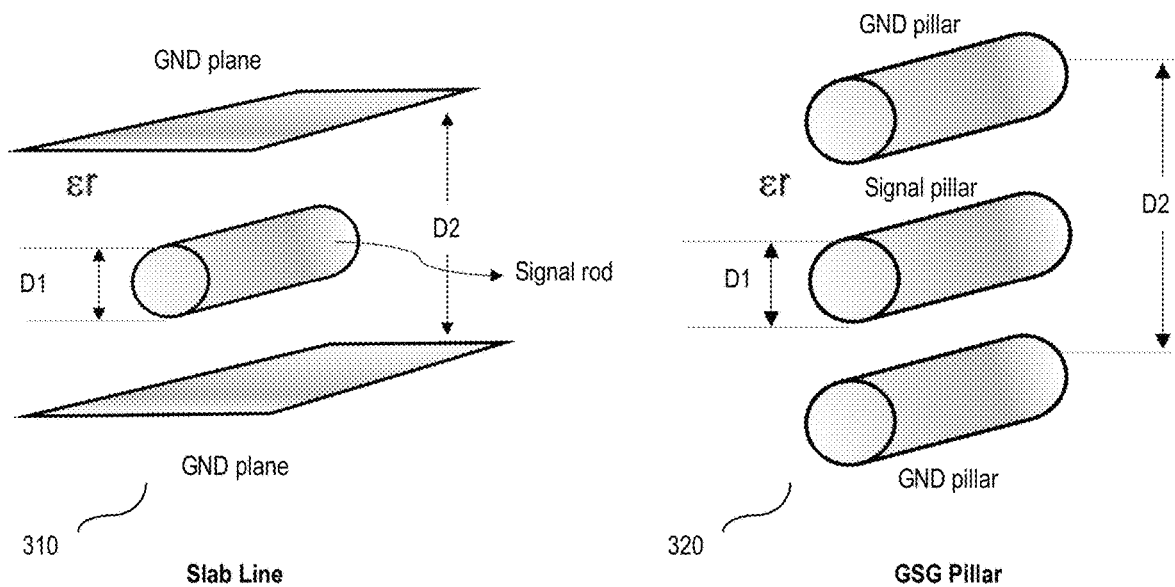
FIG. 3 depicts diagrams of a slab line and a GSG pillar structure according to one or more embodiment of the invention.

The GSG pillar structure may be similar to a slab line structure. FIG. 3 depicts diagrams of a slab line and a GSG pillar structure according to one or more embodiment of the invention. As shown in FIG. 3, the slab line structure 310 comprises a signal rod between two ground planes. Impedance of the slab line structure may be controlled by diameter (D1) of the signal rod, spacing (D2) between the two ground planes, dielectric constant εr of the ambient environment around the slab line structure. For example, when D1 is set as 60 µm, D2 is set as 240 µm, and εr is set as 3.8, impedance of the slab line structure is around 50Ω. The GSG pillar structure 320 may be similar to the slab line structure 310. Impedance of the GSG pillar structure 320 may be determined to a desired value by setting parameters including diameter of the signal pillar, distance between ground pillars, dielectric constant εr of the ambient environment (corresponding to the underfill 262) around the GSG pillar structure, etc.

Referring back to FIG. 2, the chip 210 and the substrate 220 are sealed together by mold filling 260 such that the chip 210 and the substrate 220 are united as one component for electrical connection with an external circuit, e.g., a PCB board 230. The PCB board 230 may comprise various conductors, planes, PCB vias for desired functions. In one or more embodiments, an underfill layer 262 couples between the chip 210 and the substrate 220 for additional insulation and mechanical support. In one or more embodiments, there is just an air layer or even vacuum between the chip 210 and the substrate 220.

Figure 4:
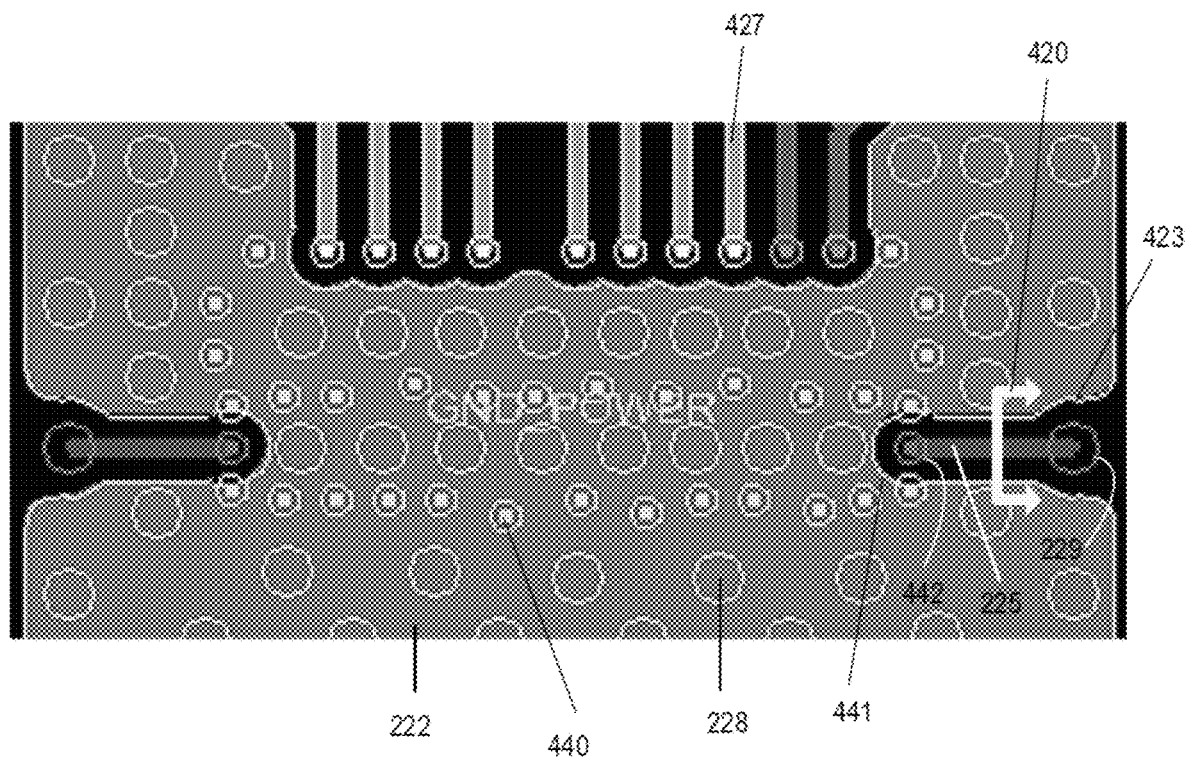
FIG. 4 depicts a top view of the substrate according to one or more embodiment of the invention.

FIG. 4 depicts a top view of the substrate according to one or more embodiment of the invention. The substrate 220 comprises a plurality of substrate vias 228 to electrically connect the top ground layer 222 to the bottom ground layer 224 (not shown in FIG. 4). The top ground layer 222 comprises a plurality of ground (GND) bump pads 440 for electrical connection to the plurality of metal pillars 240 respectively and a first signal bump pad 442 for electrical connection to the first signal pillar 242. The top ground layer 222 of the substrate has a first groove 441 surrounding the first top signal strip 225. The first signal bump pad 442 is on an inner end of the first top signal strip 225. The first top signal strip has an outer end electrically connected to the first bottom signal strip 235 through a first signal substrate via 229, which may have a diameter larger than the diameter of the first signal bump pad 442. The first bottom signal strip 235 may be electrically connected to a package pin which provides an interface between chip package and PCB board. In one or more embodiments, the first groove 441 has an indented corner 423 around the outer end of the first top signal strip such that the first top signal strip 225 and the top ground layer 222 may have a uniform gap lengthwise. The top metal layer 221 may comprises other signal strips 427 for DC bias and/or signal control.

Figure 5:
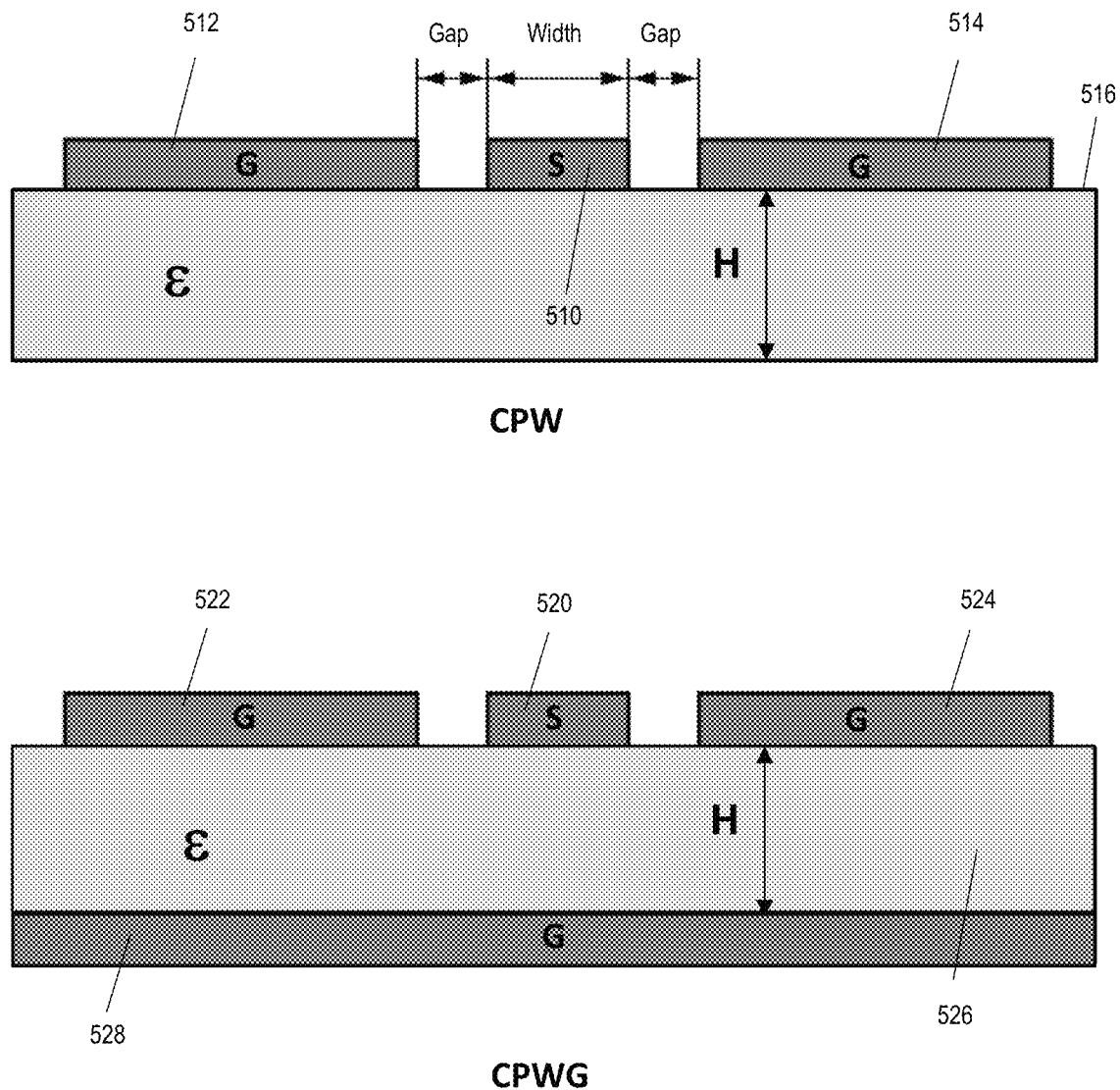
FIG. 5 depicts diagrams of a CPW structure and a CPWG structure according to one or more embodiment of the invention.

In one or more embodiments, the first top signal strip, the top ground layer and the insulation layer form a substrate CPW structure 420. A cross-sectional view of a CPW is shown in FIG. 5. A CPW is formed from a signal strip 510 separated from a pair of ground planes 512 and 514, all on the same plane, atop a dielectric layer 516. A variant of CPW is formed when a ground plane 528 is provided on the bottom side of a dielectric layer 526, while the signal strip 520 and a pair of ground planes 522 and 524, on the top side of the dielectric layer 526. Such a CPW variant is called a coplanar waveguide with ground (CPWG). Characteristic impedance of a CPW (also applied to a CPWG) may be determined by parameters including width of the signal strip, gap between the signal strip and the ground plane, thickness (H) of the dielectric layer and dielectric constant value of the dielectric layer.

Referring back to FIG. 4. The substrate CPW structure 420 may set a characteristic impedance the same or within a first predetermined range of the characteristic impedance of the GSG pillar structure 244 to lessen signal distortion or loss during millimeter wave signal transmission from the substrate to the GSG pillar structure 244, or vice versa. For example, the substrate CPW structure 420 may have a characteristic impedance within 50% to 150% of the characteristic impedance of the GSG pillar structure 244, i.e., if the characteristic impedance of the substrate CPW is set to 50Ω, the characteristic impedance of the GSG pillar structure may be within 33.3Ω to 100Ω, such that signal distortion or loss may be limited to within a predetermined threshold.

Figure 6:
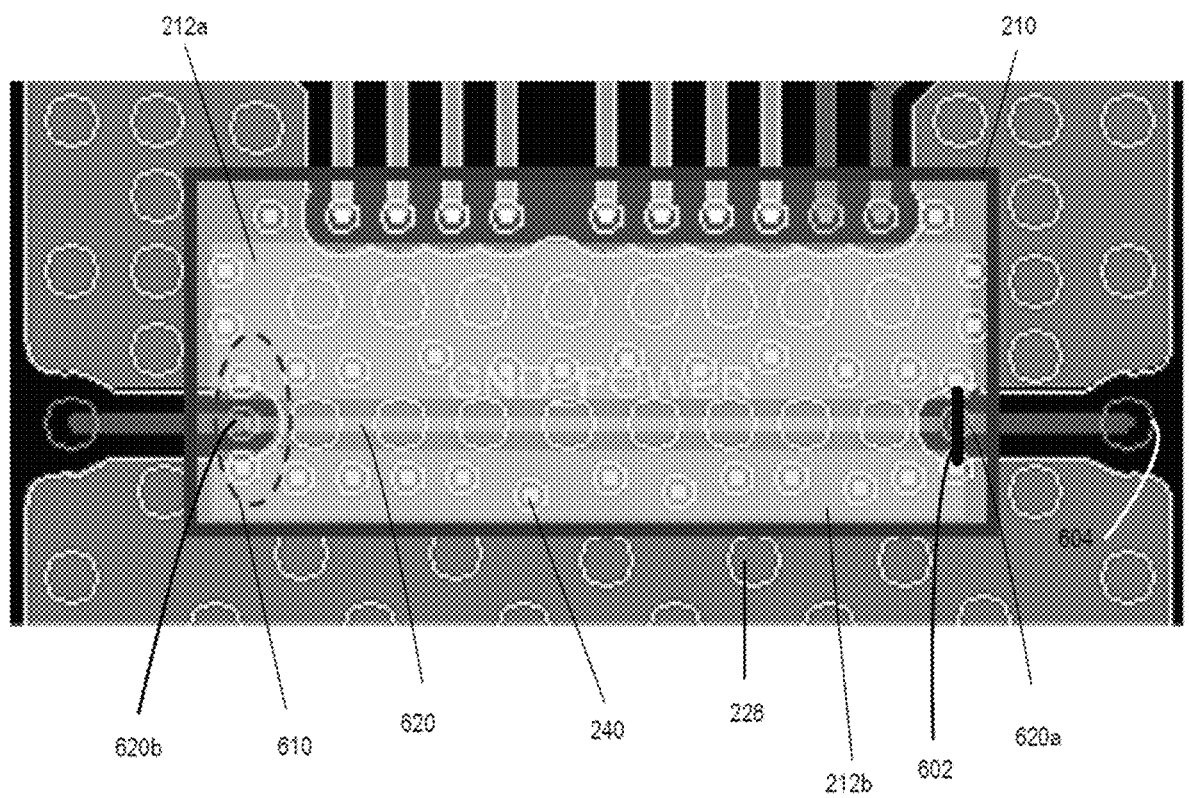
FIG. 6 depicts a top view of the substrate with a chip flipped mounted according to one or more embodiment of the invention.

FIG. 6 depicts a top view of the substrate with the chip 210 flipped mounted according to one or more embodiment of the invention. For simplicity, the chip shown in FIG. 6 comprises a first signal path 620 with two signal pads (a first signal pad 620a and a second signal pad 620b) for signal connection. The chip 210 has a ground plane with a first part 212a and a second part 212b around the first signal path 620. Accordingly, a chip CPW structure 610 is formed around each signal pad comprising a first part 212a of a ground plane, a second part 212b of the ground plane, the first signal path 620, and the chip substrate layer 215 (shown in FIG. 2). The ground plane electrically couples to the top ground layer 222 with the plurality of metal pillars 240 connected to the plurality of GND bump pads 440. The first signal pillar 242 connects to the first signal bump pad 442 to establish signal connection between the chip and the substrate.

In one or more embodiments, the chip CPW structure 610 may set a characteristic impedance the same or within a second predetermined range of the characteristic impedance of the GSG pillar structure 244 to lessen signal distortion or loss during millimeter wave signal transmission from the chip to the GSG pillar structure 244, or vice versa. For example, the chip CPW structure 610 may have a characteristic impedance within 50% to 150% of the characteristic impedance of the GSG pillar structure 244, such that signal distortion or loss may be minimized or limited to within a predetermined threshold. The second predetermined range may or may not be the same as the first predetermined range. In an optimized situation, the chip CPW structure 610, the GSG pillar structure 244, and the substrate CPW structure 420 all have the same characteristic impedance such that a RF signal may be transmitted from the substrate through the GSG pillar structure to the chip, or vice versa, with minimum loss or distortion.

Figure 7:
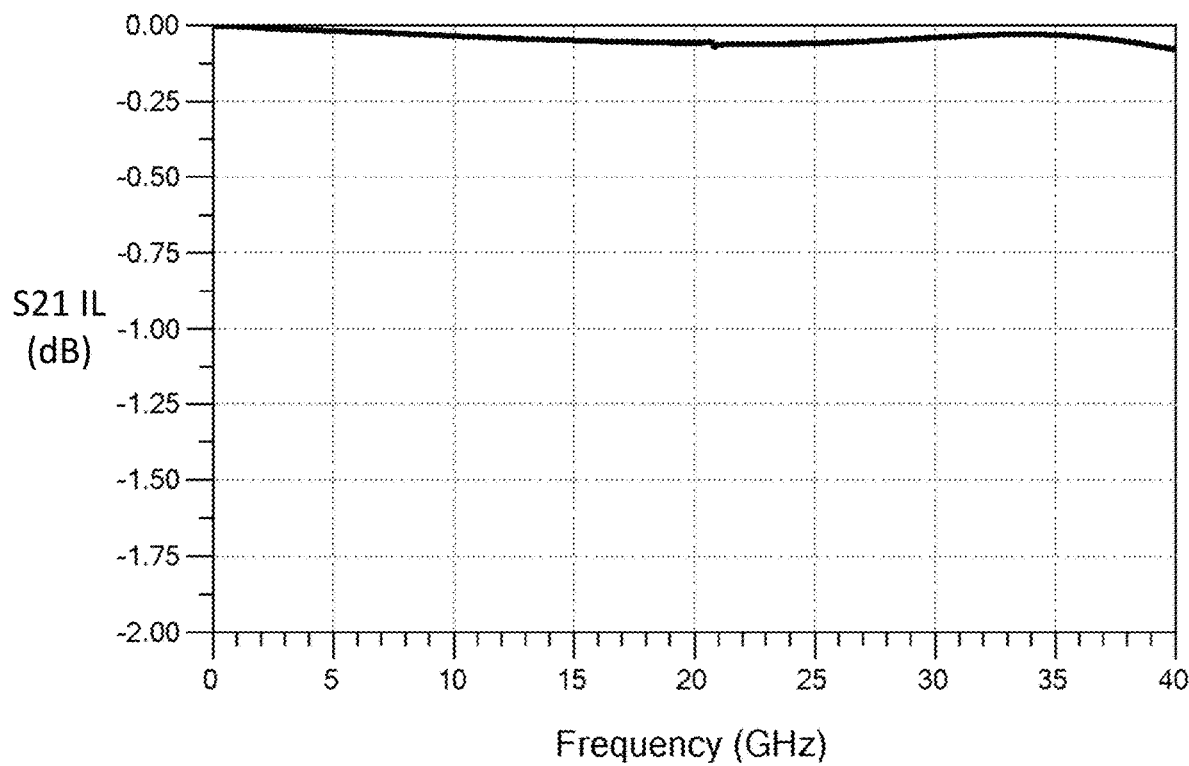
FIG. 7 depicts a simulation of radio frequency (RF) signal transition from die to package pin according to one or more embodiment of the invention.

FIG. 7 depicts a simulation of RF signal loss during transition from a port 602 on the chip to a port 604 on a PCB board under the optimized situation according to one or more embodiment of the invention. The RF signal transmits from the port 602 through a chip CPW structure, a GSG pillar structure, a substrate CPW structure, a signal substrate via, and finally reaches the port 604 on the PCB board. As shown in FIG. 7, the RF signal loss (in dB) is within a small value (less than 0.1 dB) across a wide frequency spectrum from DC to 40 GHz.

Embodiment 2

Figure 8:
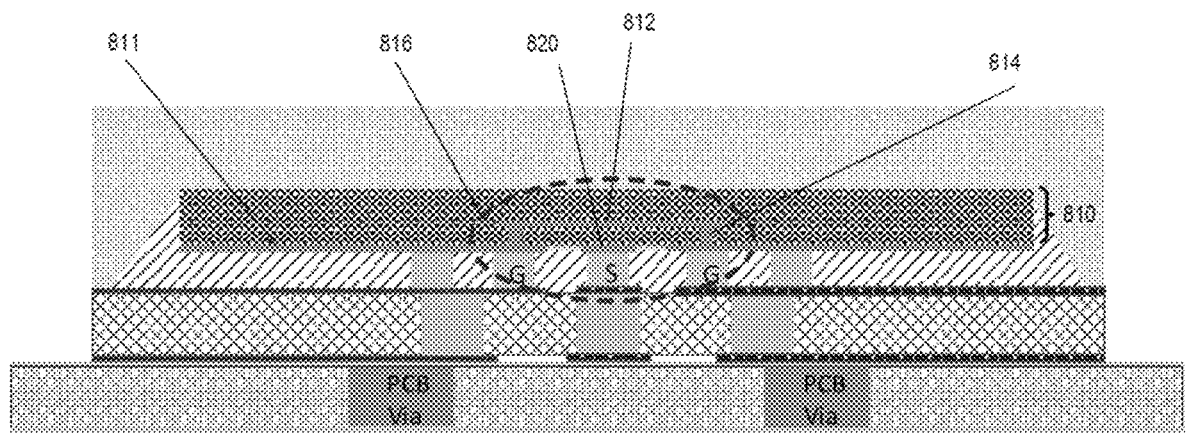
FIG. 8 depicts a cross-sectional view of a chip package with a second ground plane according to one or more embodiment of the invention.

FIG. 8 depicts a cross-sectional view of a chip package with a second ground plane according to embodiment 2 of the invention. The chip 810 further comprises a first ground plane 811 and a second ground plane 812. The second ground plane 812 is positioned above the first signal path 820 and electrically connects the first ground plane via a plurality of on-chip metal-to-metal vias 814. With the second ground plane, the first CPW structure on the chip becomes a coplanar waveguide with ground (CPWG) structure 816, which provides enhanced interference immunity of the first signal path within the chip.

Embodiment 3

Figure 9:
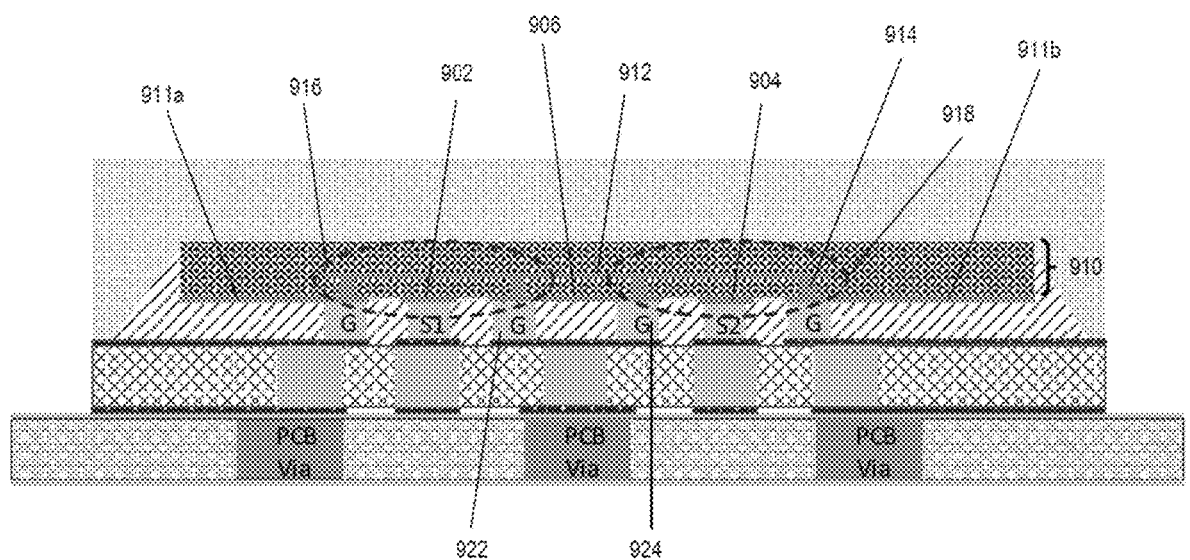
FIG. 9 depicts a cross-sectional view of a chip package with multiple signal paths and a second ground plane according to one or more embodiment of the invention.

FIG. 9 depicts a cross-sectional view of a chip package with multiple signal paths and a second ground plane according to embodiment 3 of the invention. The chip 910 further comprises a second signal path 904 separated from a first signal path 902 by a ground section 906. A second ground plane 912, electrically connected to a first ground plane (911a and 911b), and the ground section 906 via a plurality of on-chip metal-to-metal vias 914, is positioned above the first signal path 902 and the second signal path 904. Accordingly, a first CPWG structure 916 around the first signal path and a second CPWG structure 918 around the second signal path are formed. These two CPWG structures provide inter-path signal isolation within the chip through suppressing signal interference between signal paths due to leakage from chip substrate. A plurality of ground connected metal pillars 922 and 924 between the first and the second signal paths provide enhanced inter-path signal isolation through suppressing signal interference due to spatial radiation. In one or more embodiments, the ground section 906 may be a strip, a plane, or even an irregular shaped section. One skilled in the art shall understand that cross-sectional layout of the pillars may be a G-S1-G-G-S2-G (as shown in FIG. 9) or a G-S1-G-S2-G structure etc.

Embodiment 4

Figure 10:
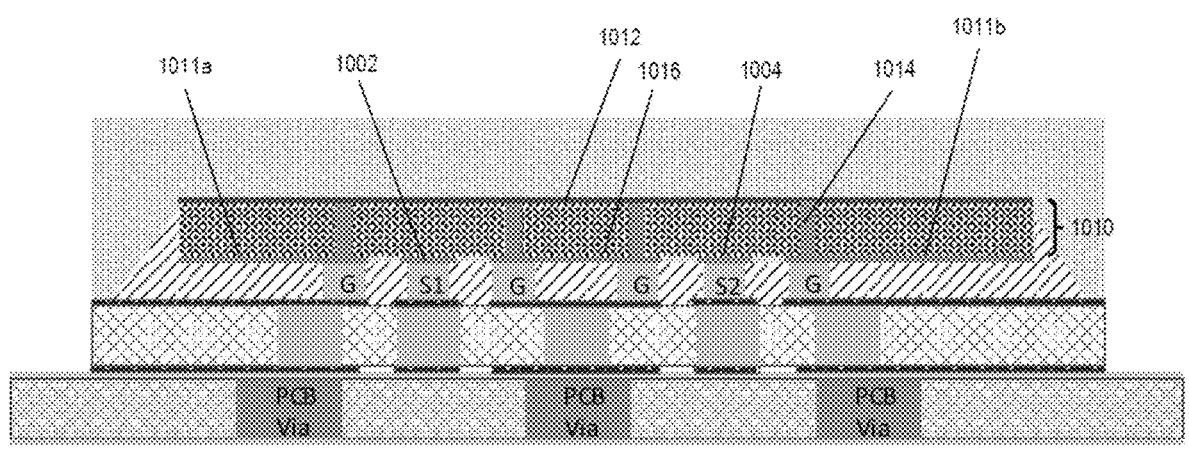
FIG. 10 depicts a cross-sectional view of a chip package with a chip backside metal plane according to one or more embodiment of the invention.

In one or more embodiments, the second ground plane of the chip is a backside metal plane 1012 electrically connected to the first ground plane and the ground section via a plurality of through-chip vias 1014, as shown in FIG. 10. Similar to FIG. 9, a first CPWG structure around the first signal path 1002 and a second CPWG structure around the second signal path 1004 are formed on the chip 1010.

Figure 11:
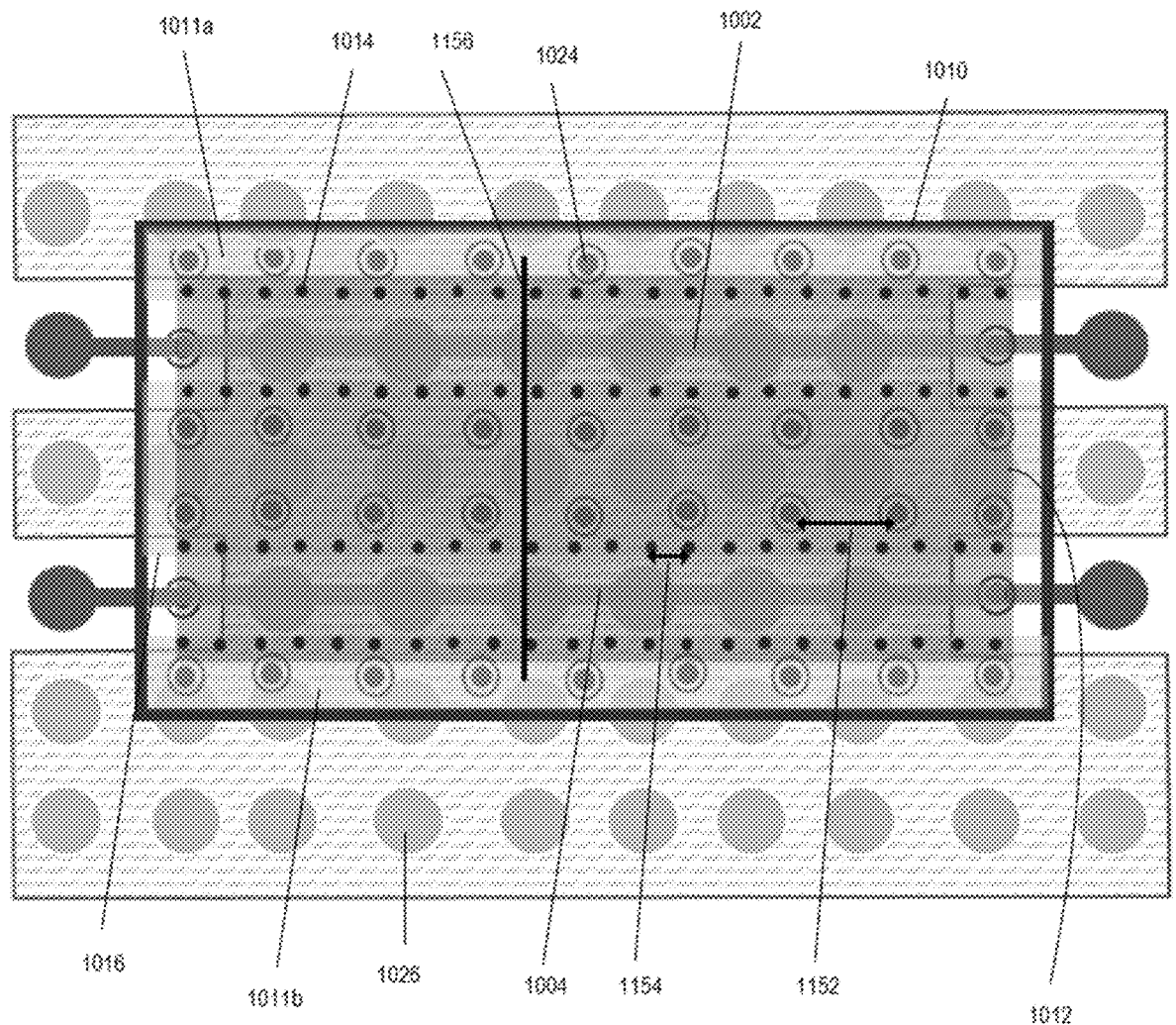
FIG. 11 depicts a top view of a chip package with multiple signal paths and a second ground plane according to one or more embodiment of the invention.

FIG. 11 depicts a top view of a chip package corresponding to FIG. 10, according to embodiment 4 of the invention. For simplicity, the first signal path 1002 and the second signal path 1004 are just straight signal paths. The first ground plane (1011a and 1011b) of the chip 1010 is connected to the top ground layer of the substrate using a plurality of metal pillars 1024. The backside metal plane 1012 electrically connected to the first ground plane and the ground section 1016 via a plurality of through-chip vias 1014, such that the through-chip vias may provide further blockage for signal leakage into the chip or signal interference between signal paths along the whole length of the signal paths. To minimize RF signal interference along the signal paths, the plurality of metal pillars are spaced closely with a first distance 1152, and the plurality of through-chip vias are spaced closely with a second distance 1154. For example, the first distance 1152 and the second distance 1154 are less than one fourth of wavelength of the RF signal transmitted along the signal paths with highest frequency.

Figure 12:
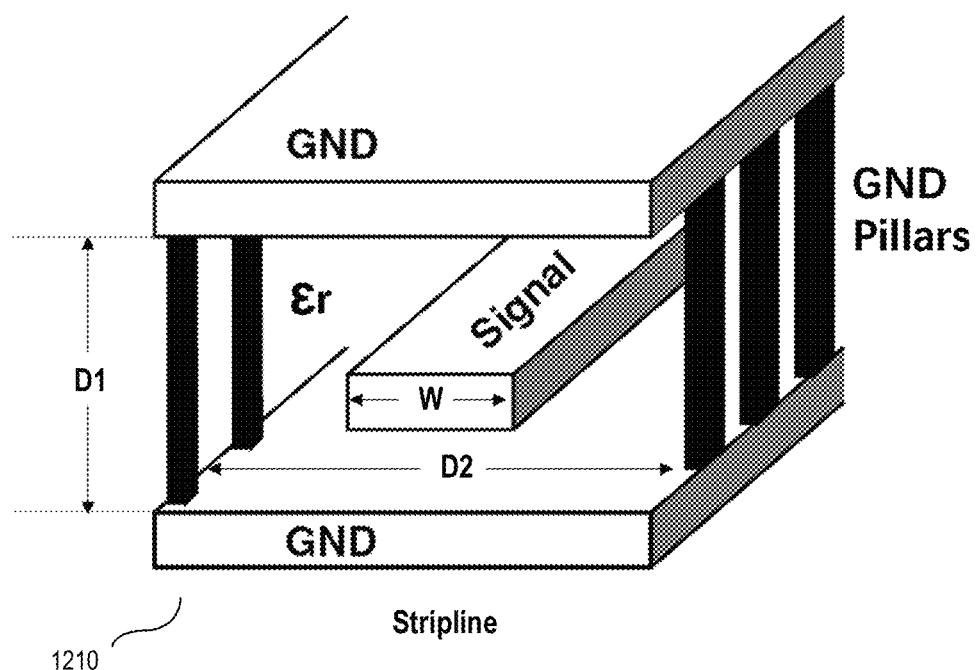
FIG. 12 depicts diagram of a stripline structure according to one or more embodiment of the invention.

FIG. 12 depicts diagram of a stripline structure according to one or more embodiment of the invention. As shown in FIG. 12, the stripline structure 1210 comprises a signal line insulatively surrounded by a top ground plane, a bottom ground plane, a left column of ground connected metal pillars, and a right column of ground connected metal pillars, thus a RF signal in the signal line producing little field leakage to the environment. A plurality of ground connected metal pillars on the left (or right) side of the signal line form a left (or right) side ground shield. If the ground connected metal pillars are spaced closely, for example, less than one fourth of wavelength of the RF signal with highest frequency, the signal line remains shielded in all four directions. Characteristic impedance of the stripline structure may be controlled by parameters including width (W) of the signal line, spacing (D1) between the two ground planes, spacing (D2) between the two ground connected metal pillars, dielectric constant εr of the ambient environment around the stripline structure.

Embodiment 5

Figure 13:
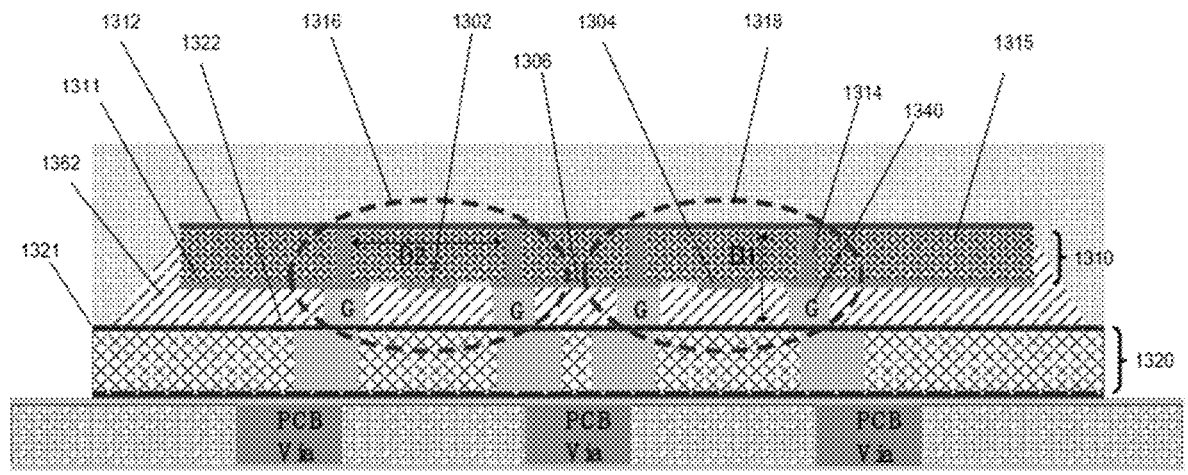
FIG. 13 depicts a cross-sectional view of a chip package with multiple signal paths and a second ground plane according to one or more embodiment of the invention.

FIG. 13 depicts a cross-sectional view of a chip package with multiple signal paths and a second ground plane according to embodiment 5 of the invention. The cross-section location in FIG. 13 is in the middle of the signal paths between signal connection interfaces (cross-section location 1156 shown in FIG. 11) instead of along a signal connection interface (such as in FIGS. 8-10), thus the signal pillar is not shown. The chip 1310 further comprises a second signal path 1304 separated from a first signal path 1302 by a ground section 1306. The chip 1310 further comprises a second ground plane 1312, which may be a chip backside metal plane or a ground plane within the chip 1310 (similar to the second ground plane 912 shown in FIG. 9). The second ground plane 1312 electrically connects to a first ground plane 1311 by a plurality of chip vias 1314, which may be through-chip vias or metal-to-metal vias. At least part of the plurality of chip vias 1314 are aligned on both sides of the first and second signal paths lengthwise. The second ground plane 1312 and a top ground layer 1322 of substrate 1320 provide ground shielding on top and bottom sides for the signal paths. A plurality of metal pillars 1340, deposited on a first ground plane 1311 of the chip, electrically connects the first ground plane 1311 to the top ground layer 1322 of substrate 1320. At least part of the plurality of metal pillars 1340 are aligned on both sides of the first and second signal paths lengthwise. The plurality of chip vias 1314 (or part of the plurality of chip vias 1314) together with the plurality of metal pillars 1340 (or part of the plurality of metal pillars 1340) provide ground shielding on left and right sides for the signal paths. Accordingly, a first stripline structure 1316 around the first signal path 1302 and a second stripline structure 1318 around the second signal path 1304 are formed. These two stripline structures provide inter-path signal isolation within the chip through suppressing signal interference between signal paths due to leakage from chip substrate and spatial radiation. Characteristic impedance of the stripline structure 1316 may be controlled by parameters including width (W) of the first signal path 1302, spacing (D1) between the second ground plane 1312 and the top ground layer 1322, spacing (D2) between the left and right sides ground shielding of the first signal path 1302, dielectric constant of the chip substrate 1315 and dielectric constant of the underfill 1362. The stripline structure 1316 may set a characteristic impedance the same or within a first predetermined range (e.g., between 50% and 150%) of the characteristic impedance of the G-S1-G pillar structure of FIG. 10 to lessen signal distortion or loss during RF signal transmission from the chip to the G-S1-G pillar structure, or vice versa. Although FIG. 13 shows a structure of multiple signal paths for blocking signal leakage and suppressing signal interference between signal paths, one skilled in the art shall understand that the stripline structure may also be applicable for chip packaging with a single RF path for signal shielding only.

Although aforementioned chip embodiments all have a straight signal path for simplicity, one skilled in the art shall understand that a chip may be a signal source chip only having one interface for signal output, a signal divider having one signal input interface and multiple output interfaces, or a signal combiner having multiple signal input interfaces and one output interface, etc. Embodiments of the abovementioned characteristic impedance matching for chip CPW structure, the GSG pillar structure, and the substrate CPW structure may be applicable for each input or output signal interface.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:

1. A system for chip packaging, the system comprising:
a substrate structure comprising:
   a top metal layer, a bottom metal layer, and an insulation layer between the top metal layer and the bottom metal layer, the top metal layer comprises a top ground layer and a first top signal strip, the bottom metal layer comprises a bottom ground layer, the top ground layer has a first groove surrounding the first top signal strip, the first top signal strip, the top ground layer and the insulation layer form a coplanar waveguide (CPW) structure on the substrate;
   one or more substrate vias electrically connecting the top ground layer and the bottom ground layer through the insulation layer; and
a chip coupled to the substrate structure, the chip comprises:
   a first ground plane electrically connected to the top ground layer via a plurality of metal pillars deposited on the first ground plane;
   a first signal pad electrically connected to the first top signal strip via a first signal pillar deposited on the first signal pad, the first signal pad electrically connects to a first signal path inside the chip, the first signal pillar has at least one metal pillar connected to ground on each side to form a ground-signal-ground (GSG) pillar structure.

2. The system of claim 1 wherein the chip further comprises a second ground plane positioned above the first signal path, the second ground plane electrically connects the first ground plane via a plurality of on-chip metal-to-metal vias, the first ground plane, the second ground plane, and at least part of the first signal path form a coplanar waveguide with ground (CPWG) structure.

3. The system of claim 1 wherein the chip further comprises a second signal path and a second ground plane, the second signal path and the first signal path are separated by a ground section, the second ground plane is positioned above the first signal path and the second signal path, the second ground plane electrically connects the first ground plane and the ground section via a plurality of on-chip metal-to-metal vias, the first ground plane, the ground section, the second ground plane and at least part of the first signal path form a first coplanar waveguide with ground (CPWG) structure, the first ground plane, the second ground plane, the ground section and at least part of the second signal path form a second CPWG structure.

4. The system of claim 1 wherein the chip further comprises a backside metal plane electrically connected to the first ground plane via a plurality of through-chip vias, the first signal path, the first ground plane and the backside metal plane form a coplanar waveguide with ground (CPWG) structure.

5. The system of claim 1 wherein the CPW structure on the substrate has a characteristic impedance within a predetermined range of a characteristic impedance of the GSG pillar structure.

6. The system of claim 5 wherein the predetermined range is 50% to 150%.

7. The system of claim 5 wherein the first signal path, the first ground plane, and a chip substrate layer form a chip CPW structure, the chip CPW structure has a characteristic impedance within a predetermined range of the characteristic impedance of the GSG pillar structure.

8. The system of claim 1 wherein the first signal pillar connects to an inner end of the first top signal strip, the bottom metal layer further comprises a first bottom signal strip, the first top signal strip has an outer end electrically connected to the first bottom signal strip through a first signal substrate via.

9. The system of claim 1 further comprising an underfill layer deposited between the chip and the substrate structure.

* * * * *